United States Patent
Haswarey et al.

(10) Patent No.: US 12,489,026 B2
(45) Date of Patent: Dec. 2, 2025

(54) HEATING ELEMENT AND SUPPORTING CIRCUITRY FOR ADAPTING A NOMINALLY RATED SEMICONDUCTOR CHIP TO AN EXTREMELY COLD ENVIRONMENT

(71) Applicant: Intel Corporation, Santa Clara, CA (US)

(72) Inventors: Aslam Haswarey, Portland, OR (US); Kevin Wells, Folsom, CA (US); Mehran Adyani-Yazdi, Hillsboro, OR (US); Daniel R. Russell, Hillsboro, OR (US); James C. Mowery, Beaverton, OR (US); Vinesh Lal, Beaverton, OR (US); Xiangying Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1319 days.

(21) Appl. No.: 16/858,457

(22) Filed: Apr. 24, 2020

(65) Prior Publication Data
US 2020/0258804 A1 Aug. 13, 2020

Related U.S. Application Data

(60) Provisional application No. 62/839,535, filed on Apr. 26, 2019.

(51) Int. Cl.
| | | |
|---|---|---|
| *H01L 23/34* | (2006.01) | |
| *H05K 1/02* | (2006.01) | |
| *H05K 1/18* | (2006.01) | |
| *H10D 89/10* | (2025.01) | |

(52) U.S. Cl.
CPC ......... *H01L 23/345* (2013.01); *H05K 1/0212* (2013.01); *H05K 1/181* (2013.01); *H10D 89/105* (2025.01)

(58) Field of Classification Search
CPC . H01L 23/345; H01L 27/0211; H05K 1/0212; H05K 1/181; H10D 89/105
See application file for complete search history.

(56) References Cited

U.S. PATENT DOCUMENTS

| | | | |
|---|---|---|---|
| 11,132,037 B2* | 9/2021 | Nowell | G01K 3/005 |
| 2011/0296155 A1* | 12/2011 | Belady | G06F 9/44 |
| | | | 713/300 |
| 2013/0128452 A1* | 5/2013 | Baquiano | H05K 1/0201 |
| | | | 361/679.54 |

(Continued)

OTHER PUBLICATIONS

Prior Art Statement.

*Primary Examiner* — Jeff W Natalini
*Assistant Examiner* — Brandon C Fox
(74) *Attorney, Agent, or Firm* — Compass IP Law PC

(57) ABSTRACT

A thermal control circuit is described. The thermal control circuit includes a heating element disposed within an electronic circuit board having a semiconductor chip disposed thereon. The thermal control circuit includes a power management integrated circuit coupled to the heating element. The power management integrated circuit is to enable the heating element to heat the semiconductor chip at least to the semiconductor chips' lowest rated operating temperature prior to the semiconductor chip being placed in a fully operational state.

14 Claims, 6 Drawing Sheets

(56) References Cited

U.S. PATENT DOCUMENTS

| | | | |
|---|---|---|---|
| 2014/0298825 A1* | 10/2014 | Noshadi | H10N 10/17 62/3.3 |
| 2018/0203496 A1* | 7/2018 | Campbell | G06F 1/266 |
| 2019/0273029 A1* | 9/2019 | Tuttle | H01L 21/56 |

* cited by examiner

HEATING ELEMENT AND SUPPORTING CIRCUITRY FOR ADAPTING A NOMINALLY RATED SEMICONDUCTOR CHIP TO AN EXTREMELY COLD ENVIRONMENT

RELATED CASES

This application claims the benefit of U.S. Provisional Application No. 62/839,535, entitled, "HEATING ELEMENT AND SUPPORTING CIRCUITRY FOR ADAPTING A NOMINALLY RATED SEMICONDUCTOR CHIP TO AN EXTREMELY COLD ENVIRONMENT", filed Apr. 26, 2019, which is incorporated by reference in its entirety.

BACKGROUND

System designers are regularly being faced with challenging environments that the components of their system may be subjected to. Ideally, these challenges are met with a cost effective solution that relies upon less expensive standard parts that are made to adapt to the challenging environment.

FIGURES

A better understanding of the present invention can be obtained from the following detailed description in conjunction with the following drawings, in which.

DETAILED DESCRIPTION

Figure 1:
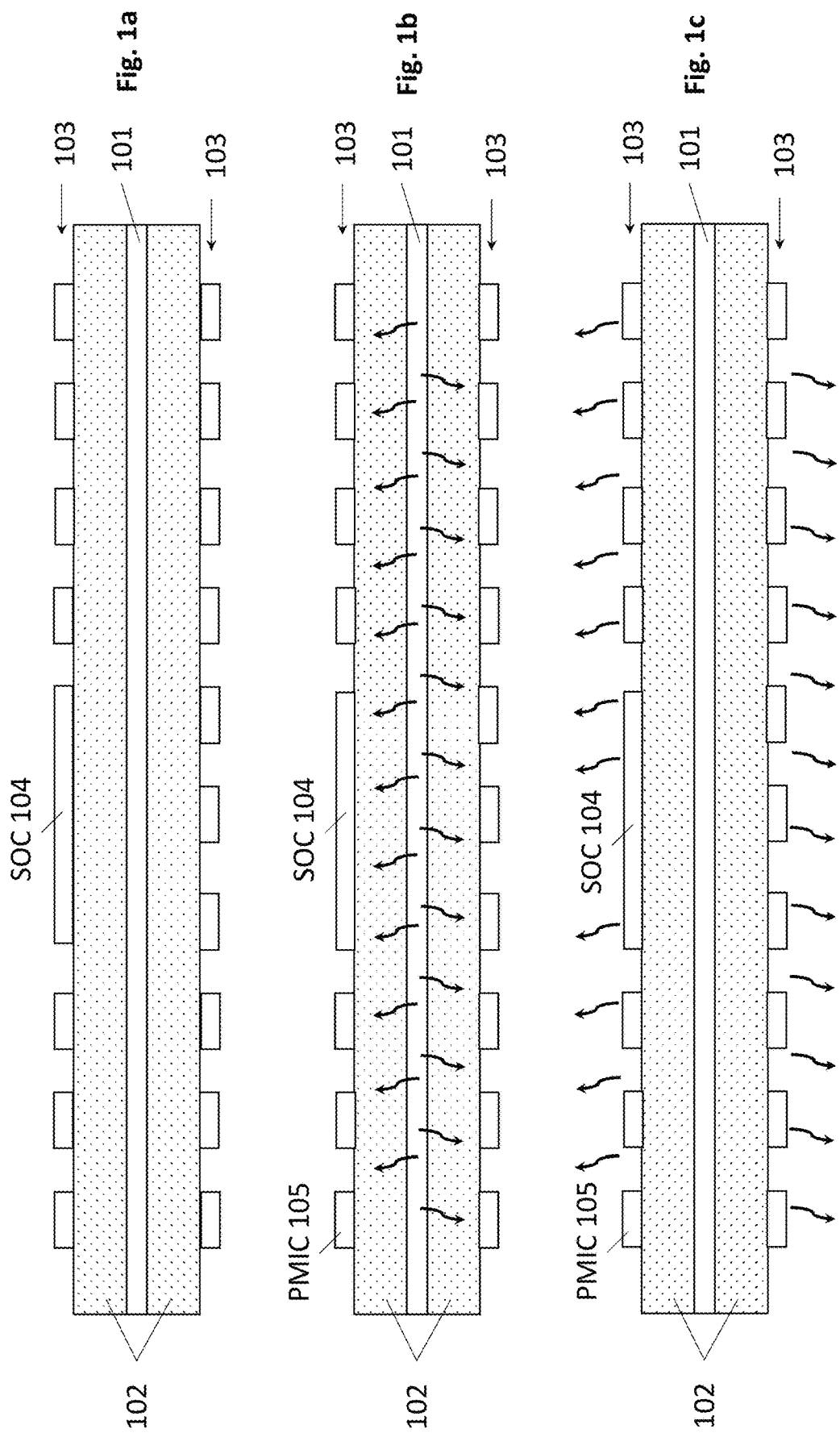
FIGS. 1a, 1b and 1c show a method for heating a semiconductor chip.

The semiconductor chip industry ships semiconductor chips according to a set of functional specifications. Here, each chip is guaranteed by its manufacturer to meet certain functional characteristics provided, among other constraints, that the applied temperature and supply voltage(s) are within in a certain range. With respect to temperature, the industry standard "commercial grade" temperature range is 0° C. to 85° C.

Unfortunately, particularly with the onset of wireless communications, systems having commercial grade semiconductor chips are not uncommonly in environments where the temperature is less than 0° C. For example, consider the semiconductor chips in a base station or cell tower that are subjected to ambient "outdoor" temperatures. As many inhabited regions experience temperatures below 0° C., any systems that are exposed to the outdoor ambient can be subjected to temperatures less than 0° C. Another example is "home servers", e.g., where small-office or home-office has a server computer that is kept outside the office/home (e.g., on a back porch, next to an air-conditioner, etc.)

In many such circumstances, the operating temperature of the semiconductor chips is less than 0° C. only upon immediate power-up of the system. That is, once the system is powered up and running, the semiconductor chips are receiving supply voltages and processing signals. The processing of the signals with the applied supply voltages causes the semiconductor chips to consume power. The semiconductor chips then radiate the power consumption as thermal energy (heat).

Thus, after a computing system has been actively running for some time, the heat radiated by the operating semiconductor chips warms the chips and their ambient environment to a temperature above their lowest rated temperature (0° C.).

In the time span from initial power on until the chip and ambient temperatures rise above 0° C., however, the semiconductor chips are not within their specified temperature range. As a consequence, their functional performance is not guaranteed (they may not operate correctly). Thus, in the moments after initial power-on of a system composed of a commercial grade semiconductor chips in "below zero" centigrade temperatures, the system may malfunction. Such malfunctions may even be catastrophic (e.g., the system becomes operationally deadlocked after reaching an undefined ("unreachable") logical state).

Here, large and complex logic semiconductor chips (e.g., a multi-core processor system-on-chip (SOC)), owing to the sheer number of integrated logic transistors (e.g., billions) and low operating voltage (e.g., less than one volt) are particularly susceptible to malfunction when operating at temperatures below the low end of their nominally rated temperature range.

A prior art solution includes constructing systems that may be exposed to low ambient temperatures with semiconductor chips having a lower temperature operating range (e.g., military grade semiconductor chips). However, such chips are generally more expensive as they generally require a special design, a special manufacturing process or at least special testing (e.g., if a small subset of commercial grade parts demonstrate correct functioning at lower temperatures).

FIGS. 1a through 1c depict an improved approach in which a heating element 101 is disposed in the electronic circuit board 102 ("PC" board or planar board) that the semiconductor chips 103 are mounted on. Here, as depicted in FIG. 1a, the system includes an electronic circuit board 102 with a number of semiconductor chips 103 mounted on both sides of the board. At least one of these semiconductor chips is a large, complex chip such as a multi-core processor SOC 104 (hereinafter, "SOC"). The electronic circuit board 102 also includes a heating element 101 that is designed into the board. In FIG. 1a, the system is in a powered off state and the ambient is less than 0° C.

In FIG. 1b, the system is powered on. The powering on of the system causes a power management integrated circuit (PMIC) semiconductor chip 105, e.g., specified to operate at less than 0° C., to turn on and operate. However, because the ambient is less than 0° C. (and/or as a default initial power-on state), the system's SOC 104, having a rated lowest operating temperature of 0° C., is not permitted to operate (e.g., it is held in an off state). The PMIC 105 detects that the temperature is less than 0° C. and causes the heating element 101 to be enabled (e.g., by closing a switch between the heating element and a voltage supply). The enabling of the heating element 101 causes the heating element 101 to warm, which, in turn, warms the electronic circuit board 102 and the chips 103 that are mounted to the board, including the SOC 104. The PMIC 105 monitors the temperature of the SOC 104 while the heating element 101 continues to warm the board 102.

In FIG. 1c, the PMIC 105 detects that the SOC's temperature is above 0° C. As such, the PMIC 105 turns off the heating element 101 and permits the SOC 104 to begin operation (e.g., it is brought out of off state and begins loading, e.g., boot-up firmware). The other chips 103 can also be held in off state until their temperatures reach their rated minimum. As such, the entire system may come out of off state and begin operating (e.g., loading and/or execution of boot-up program code) after the PMIC 105 detects the temperatures of the chips 103 (including SOC 104) are above their rated minimum. Full operation of the system causes the chips to generate heat that keeps their respective temperatures above their rated minimum temperature.

Figure 2:
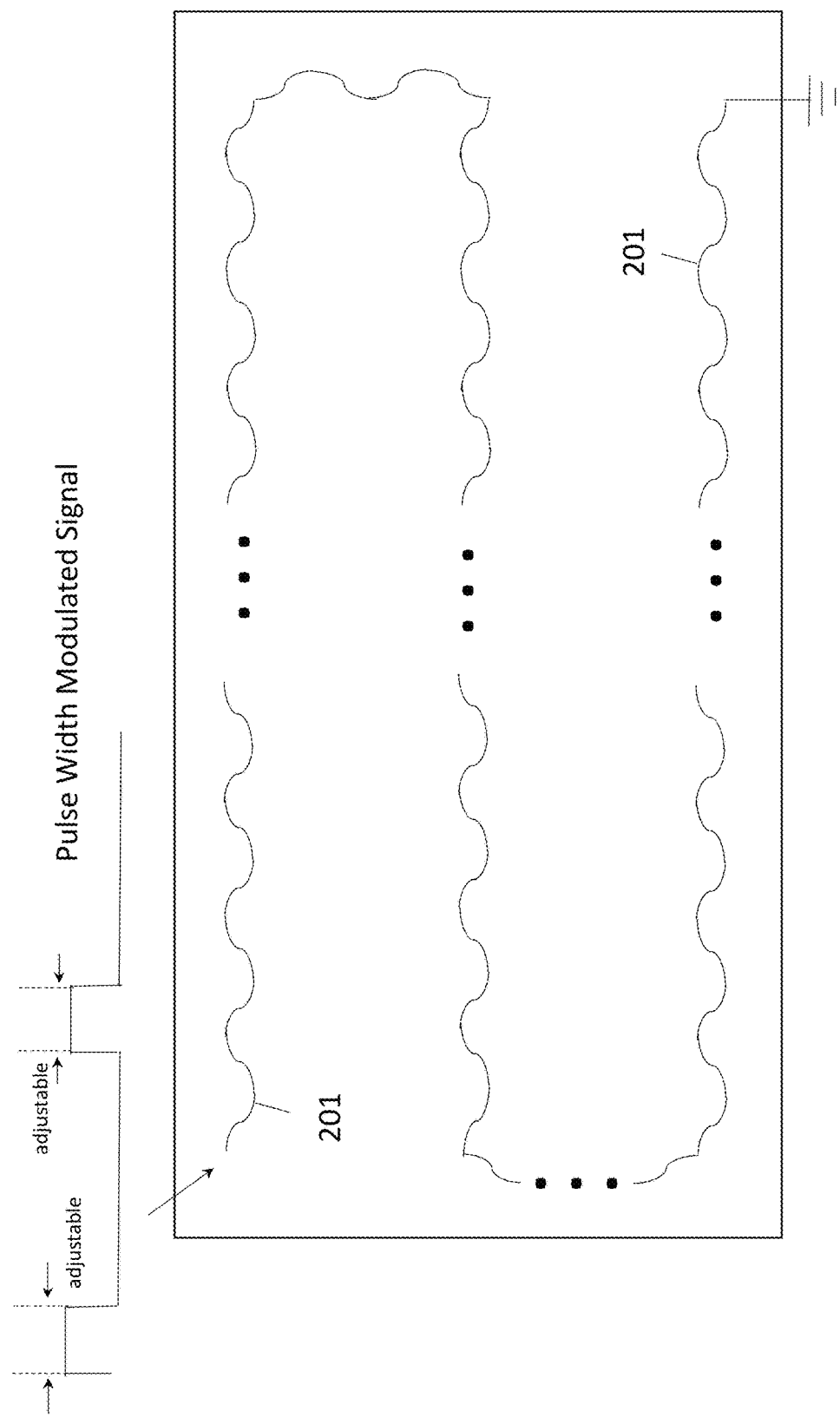
FIG. 2 shows a heating element structure that is manufacturable within a wiring layer of an electronic circuit board.

In an embodiment, as depicted in FIG. 2, the heating element is designed into the electronic circuit board by designing wiring structures to have a specific impedance (resistance and series inductance). As observed in FIG. 2, the heating element is composed of a lengthy wiring trace 201 patterned in a metal layer of a multi-level board (composed of alternating metal and dielectric layers). The width of the trace and the end-to-end length of the trace determines the trace's total resistance. Although FIG. 2 only depicts three rows of connected trace structures, the single heating element trace can be composed of more than three rows.

The resistance of the heating element 201 determines the maximum heat the heating element will radiate as a function of the voltage that is applied to it. In various embodiments, as described in more detail below, the PMIC causes a pulse-width-modulated signal to be applied to the heating element to determine the amount of heat to be applied to the board. As is known in the art, a pulse-width-modulated signal is a signal composed of series of electrical pulses, where, the temporal width and frequency of the pulses can be modulated (changed).

The PMIC modulates the pulse widths and frequency of the pulse width modulated signal to set different root-mean-square (rms) voltages for the signal, where, different rms voltages corresponds to different amounts of energy delivered to the heating element. Correspondingly, "temperature ramps" of differing slope will be dissipated by the heating element over time as a function of the rms voltage. Specifically, narrower pulse widths and fixed frequency correspond to smaller rms voltages and shallower temperature ramps, whereas, wider pulse widths correspond to larger rms voltages and steeper temperature ramps.

Note that if the heating element generates too much heat too quickly (too steep a temperature ramp), thermally induced damage can occur within the board, the semiconductor chips and/or the electrical/mechanical connections between the board and semiconductor chips. Said another way, too steep a temperature ramp can induce a thermal shock to the system that causes certain materials or bonds to break. Therefore, in various embodiments, the PMIC is designed to carefully control the power that is delivered to the heating element so that the SOC (and other chips) reaches minimum operating temperature in as short a time as possible but without inducing any thermal shock related damage to the system.

For ease of discussion the remainder of the discussion will assume that only a single SOC's temperature is monitored or used as a basis for controlling the heating element. The reader should understand, however, that the temperature of more than one SOC or other semiconductor chip (e.g., all of semiconductor chips 103) may be involved in the control of the heating element. In other embodiments, multiple heating element circuits can be implemented to independently heat regions of the board. For example, the heating element may be enabled and/or otherwise controlled based on the "coldest" SOC or semiconductor chip that the PMIC monitors at any moment of time.

Regardless, in various embodiments the PMIC includes embedded intelligence that sets a particular pulse width and frequency so that the resulting temperature ramp is as steep as generally possible but not steep enough to cause thermal shock damage. In an embodiment, the particular pulse width (or temperature ramp) and frequency is initially set as a function of how far below 0° C. the initially measured temperature of the SOC is. Here, steeper ramps can be applied for SOC temperatures that are modestly below 0° C. (because they will be applied for less time given the small temperature change), whereas, less steep temperature ramps are applied for SOC temperatures that are more significantly below 0° C. (because they will be applied for more time given the larger temperature change).

In various embodiments, the PMIC continuously monitors the heat generated by the heating element and/or the temperature of the SOC and adjusts the temperature ramp setting as needed (e.g., increasing the steepness of the temperature ramp if there is some thermal ramp budget before thermal damage occurs, or, lowering the steepness of the temperature ramp if such a budget is being encroached upon). Again, raising the steepness of the thermal ramp's slope is accomplished by increasing the pulse-width modulated signal's pulse width at a given frequency and lowering the steepness of the thermal ramp's slope is accomplished by decreasing the pulse-width modulated signal's pulse width.

Also, in various embodiments, the heating element's wiring structure is composed of a metal (e.g., copper) that noticeably changes its resistance as a function of temperature (e.g., copper increases its resistance 0.39% for every increase of one degree in heating element temperature). As such, as the PMIC is designed to understand that the resistance of the heating element is increasing as the heating element's temperature ramps up. Thus, in order to keep a constant thermal ramp, the PMIC repeatedly reduces the pulse width of the heating element signal from its initial setting to accommodate the steadily increasing resistance of the heating element (the heating element's power dissipation is proportional to its resistance so less current should flow through the thermal element as its resistance increases).

Thus, to review, the PMIC is designed/configured to: 1) determine the initial thermal ramp that is appropriate for the heating element based on the initial temperature reading (of the SOC and/or ambient, etc.); 2) determine and set the pulse-width and frequency for the heating element signal based on the initial thermal ramp determination; 3) determine and set adjustments to the pulse width based on measured or calculated changes in the heating element's resistance caused by its rising temperature; and, 4) turn off the heating element (cease the sending of the pulse modulated signal to the heating element) when the SOC and/or ambient have reached a pre-determined objective temperature (e.g., minimum operating temperature of the SOC).

Here, because of the different tasks the PMIC is asked to perform (e.g., as described in the paragraph just above) and because of the different value ranges the PMIC can be asked to process (e.g., different initial temperatures, different temperature ramps, different heating element resistances, maximum allowable power to the system, different thermal capacitances of different boards (which affects thermal ramping), etc.), the functional versatility offered by programming such functions (e.g., as opposed to hardwiring them) makes execution of them in program code (e.g., firmware) a favored option for many applications.

As such, in various implementations of the PMIC includes an embedded controller or processor (hereinafter, just "processor") so that the heating element control algorithm(s) can be implemented by executing program code. It is notable that the Applicants are not aware of any commercially available PMICs that include an embedded processor. Other implementations may choose to implement these functions in traditional hardwired form (e.g., dedicated ASIC/state machine), as programmable logic circuitry (e.g., field programmable gate array (FPGA)) or any combination of program code execution, hardwired and programmed logic circuitry.

Figure 3:
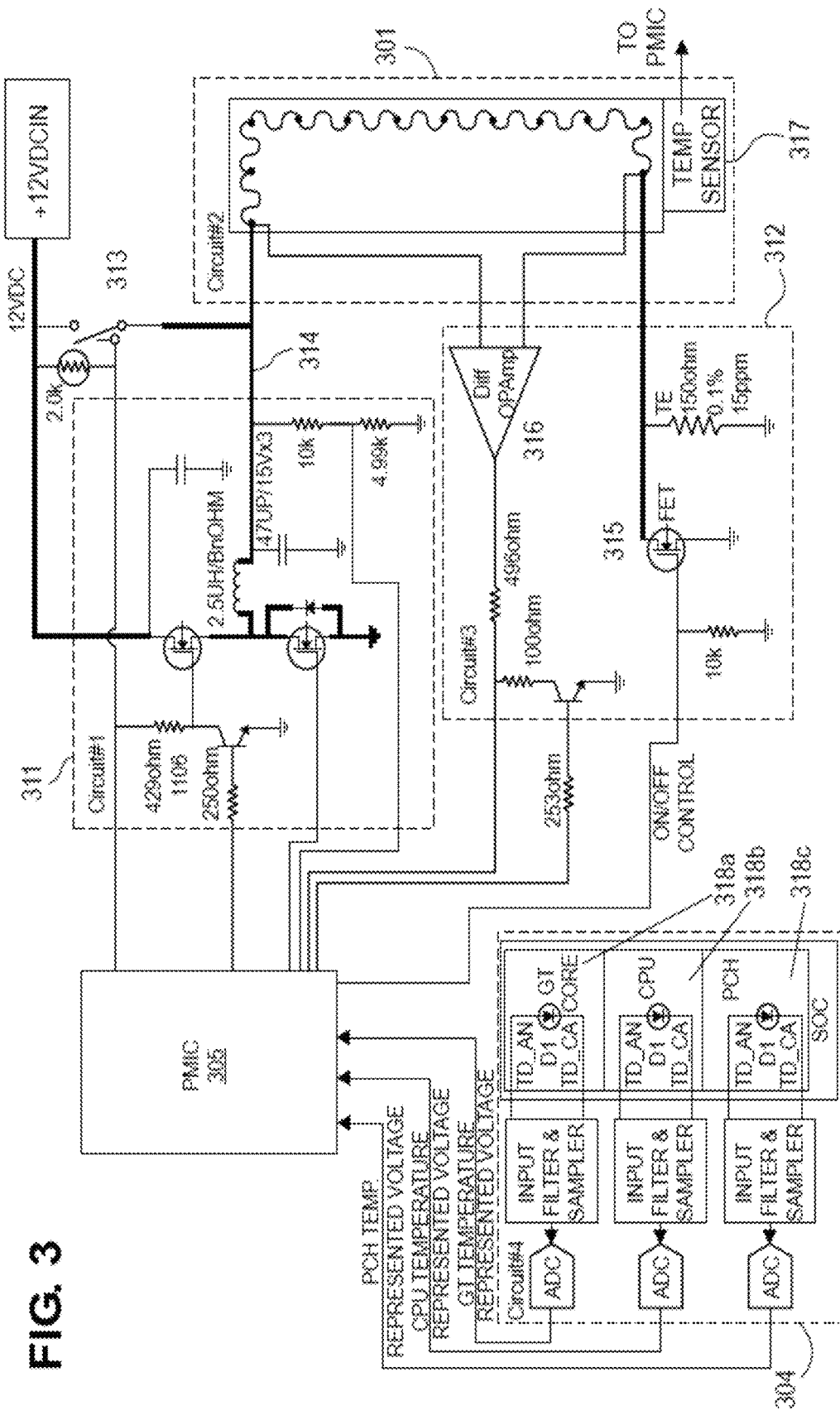
FIG. 3 shows an embodiment of a thermal control circuit.

FIG. 3 shows an embodiment of the electrical design for the circuitry used to implement the heating element control function. As observed in FIG. 3, the circuit includes the heating element 301, the SOC 304 and the PMIC 305. Additional support circuitry 311, 312 and 313 are also shown. Here, as described in more detail below, support circuit 312 can be used with either circuit 311 or circuit 313 to effect proper control over the heating element.

A first support circuit implementation includes circuits 311 and 312. Circuit 311 is a power delivery switch circuit that delivers the pulse width modulated +12V power signal to the heating element 301 at node 314. A pulse width modulated signal from the PMIC is applied to the power switch in circuit 311. Here, when the PMIC 305 wants to send a pulse width modulated signal to the heating element 301 it ensures that switch 315 is actuated so that the +12V supply is applied through the power switch 311 circuit to the heating element 301. Switch 315 is a safety switch transistor that acts as a cutoff as necessary in case of a stuck at fault in circuit 311.

A second support circuit implementation includes support circuits 312 and 313 which, pulse current through the heating element 301. Here, for example, as an initial state, the safety switch transistor 313 is cutoff by the PMIC 305 so that no current is permitted to flow through the heating element 301 as an initial default state (which also acts as a cutoff safety circuit in case of a stuck at fault on circuit 312). After the PMIC 305 determines the ambient temperature and/or SOC 304 temperature and determines the correct pulse width modulation, the PMIC 305 is ready to enable the heating element 301. In order to enable the heating element 301 the PMIC 305 activates the safety switch transistor 315 to permit current to flow through the heating element 301 and activates switch 313 to direct the +12V supply. After the SOC 304 has been properly heated, the PMIC 305 quasi-permanently disables the heating element 301 (at least until the next system power on event) by placing the safety switch transistor 313 in cutoff mode.

In various embodiments the PMIC 305 includes (programmed or otherwise) functionality that can detect emergency conditions such as thermal runaway temperatures that exceed specifications and/or serious functional failures of the SOC and/or board/system. In response to some or all of these emergencies, the PMIC 305 is designed to automatically cutoff the safety switch transistor 315 or 313 to ensure that no current flows through the heating element 301 during the detected emergency state.

Circuit 312 also includes first feedback circuitry 316 for determining the heating element 301 temperature. Here, amplifier 316 measures the voltage drop across the heating element 301. With knowledge of the heating element's resistance (which is based on the heating element's temperature) the heating element temperature can be calculated from the fact that Copper resistance increases by 0.39% per degree Celsius. Therefore the PMIC 305 can determine the temperature of the heating element 301 with a formula knowing the starting temperature and resistance of the heating element 301.

In further embodiments the heating element includes an embedded thermistor 317 or other temperature measuring device. The heating element temperature that was calculated from the voltage drop measurement can be compared with the directly measured temperature as a redundant mechanism for ensuring that the heating element's current temperature is known with a high degree of confidence.

The SOC temperature is measured by sensing the on-die thermal diode. The on-die thermal diode is enabled by driving a current across the thermal diode and reading back the voltage drop across it. The SOC internal thermal diodes 318a-c or other embedded temperature sensors can provide values of temperature measurements to the PMIC 305.

The PMIC 305 can then use these readings to monitor the thermal ramping and/or determine when the SOC 304 has been sufficiently heated so as to disengage the heating element 301. In other or combined embodiments, the thermal ramping can be monitored by theoretical calculations of the heating element temperature, or actually measured values of the heating element's temperature by thermal sensors in 304. The heating element 301 may be disabled by the PMIC 305 once some assessment of one or both the theoretical and actually measured SOC temperatures indicate the SOC has been sufficiently heated.

As observed in FIG. 3, the SOC may include multiple temperature sensing devices 318a-c from, e.g., different thermal diode components within the SOC (e.g., graphics processor ("GT"), general purpose processing core ("CPU"), peripheral control hub ("PCH")). Here, the more measured temperatures within the SOC the better understanding the PMIC 305 will have of the effects of the heating element's heat on the temperature profile within the SOC.

Although the above description has been directed to embodiments where the lowest rated operating temperature is 0° C., in other embodiments, the lowest rated (or other target) temperature may be above or below 0° C.

Figure 4:
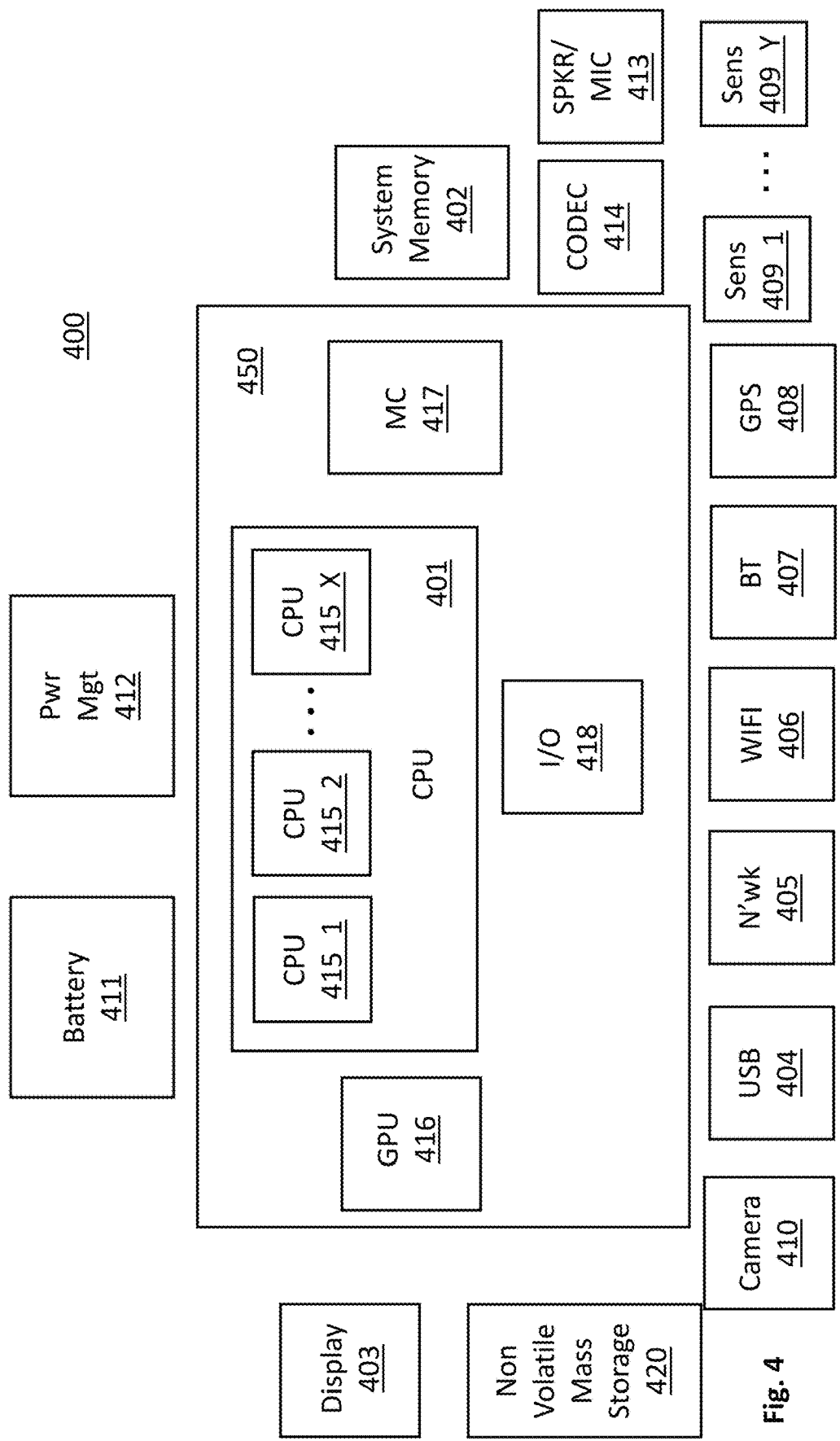
FIG. 4 shows a computing system.

FIG. 4 provides an exemplary depiction of a computing system 400 such as a server or other higher performance computer within a data center. As observed in FIG. 4, the basic computing system 400 may include a central processing unit 401 (which may include, e.g., a plurality of general purpose processing cores 415_1 through 415_X) and a main memory controller 417 disposed on a multi-core processor or applications processor, system memory 402, a display 403 (e.g., touchscreen, flat-panel), a local wired point-to-point link (e.g., PCIe, USB) interface 404, various network I/O functions 405 (such as an Ethernet interface and/or cellular modem subsystem), a wireless local area network (e.g., WiFi) interface 406, a wireless point-to-point link (e.g., Bluetooth) interface 407 and a Global Positioning System interface 408, various sensors 409_1 through 409_Y, one or more cameras 410, a battery 411, a power management control unit 412, a speaker and microphone 413 and an audio coder/decoder 414. The CPU 401 or other processor (e.g., GPU) or other high-performance semiconductor chip may include a heat sink assembly having a pre-loaded bolt as described herein and/or a carrier with anti-tile posts as described herein.

An applications processor or multi-core processor 450 can be an SOC that includes one or more general purpose processing cores 415 within its CPU 401, one or more graphical processing units 416, a memory management function 417 (e.g., a memory controller such as a "system" or "main" memory controller) and an I/O control function or peripheral hub controller (or, peripheral control hub (PCH)) 418. The general-purpose processing cores 415 typically execute the operating system and application software of the computing system. The graphics processing unit 416 typically executes graphics intensive functions to, e.g., generate graphics information that is presented on the display 403. The memory control function 417 interfaces with the system memory 402 to write/read data to/from system memory 402.

Each of the touchscreen display 403, the communication interfaces 404-407, the GPS interface 408, the sensors 409, the camera(s) 410, and the speaker/microphone codec 413, 414 all can be viewed as various forms of I/O (input and/or output) relative to the overall computing system including, where appropriate, an integrated peripheral device as well (e.g., the one or more cameras 410). Depending on implementation, various ones of these I/O components may be integrated on the applications processor/multi-core processor 450 or may be located off the die or outside the package of the applications processor/multi-core processor 450. The computing system also includes non-volatile storage 420 which may be the mass storage component of the system. The peripheral control hub 408 controls data between the computer and any one of the I/O components and/or mass storage. The peripheral control hub 408 can be integrated on a same die (e.g. SOC) as the general purpose processing cores and main memory controller.

Here, most/all of the components discussed above with respect to FIG. 4 may be integrated into a same computing system rack mountable component. Alternatively, primarily certain ones of the components discussed above with respect to FIG. 4 (e.g., primarily the application processors, primarily the application processors and memory, primarily the memory, primarily GPUs, primarily non volatile storage, etc.) may be integrated into a computing system component rack mountable component.

Figure 5:
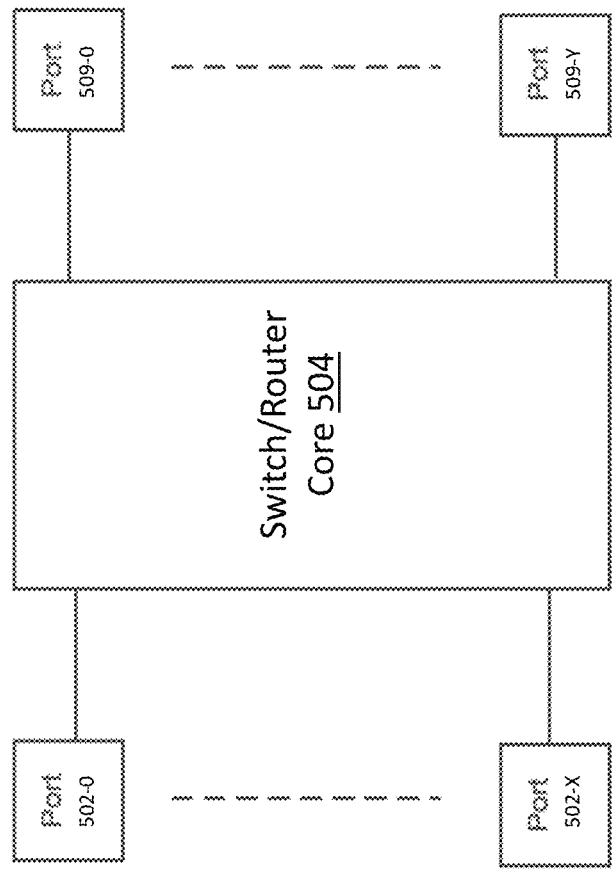
FIG. 5 shows a networking system.

Although embodiments above stressed integration of an electronic circuit board with heating element into a computing system or computing system component, other embodiments can integrate such a motherboard into a rack mountable networking system such as a rack mountable networking switch or router. FIG. 5 depicts a view of a networking switch or router. Switch/router core 504 can switch/route packets or frames of any format or in accordance with any specification from any port 502-0 to 502-X to any of ports 506-0 to 506-Y (or vice versa). Any of ports 502-0 to 502-X can be connected to a network of one or more interconnected devices. Similarly, any of ports 506-0 to 506-X can be connected to a network of one or more interconnected devices. Switch/router core 504 can decide which port to transfer packets or frames to using a table that maps packet characteristics with an associated output port. In addition, switch/router core 504 can perform packet replication for forwarding of a packet or frame to multiple ports and queuing of packets or frames prior to transfer to an output port. Here, the switch core may be integrated on a motherboard and the ports may be integrated on adaptor cards that are plugged into the riser card assembly described at length above.

Figure 6:
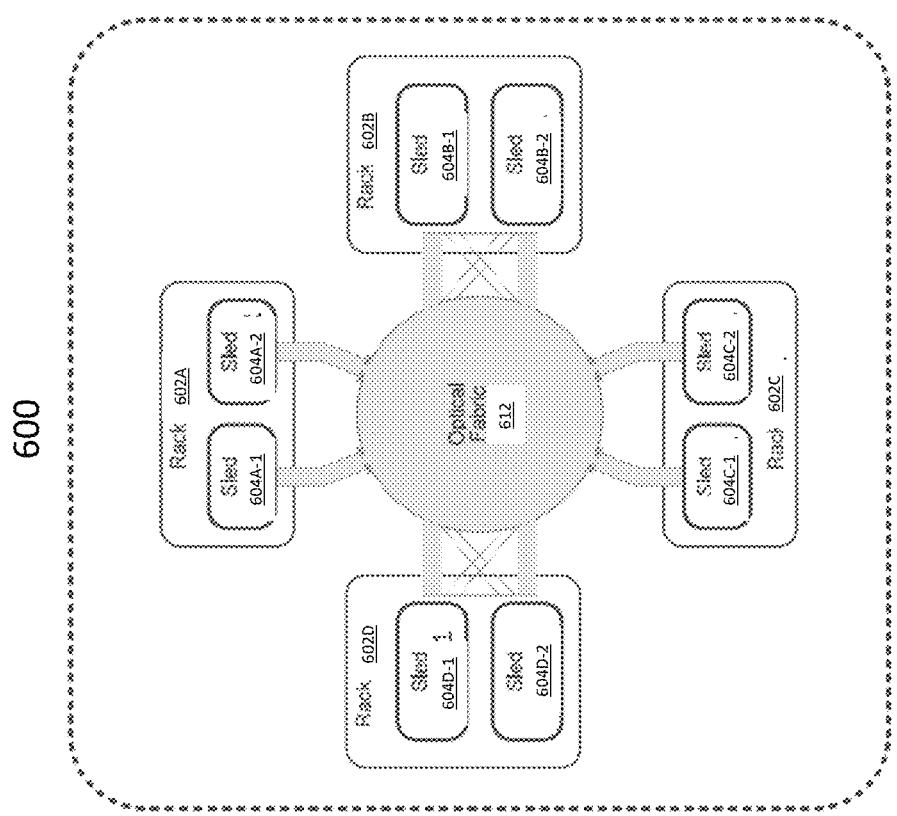
FIG. 6 shows a data center.

Any of the rack mountable components referred to above may be mounted into a rack of a data center. FIG. 6 depicts a more detailed example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. The signaling connectivity that optical fabric 612 provides to any given sled may include connectivity both to other sleds in a same rack and sleds in other racks.

A rack mountable component may be implemented, e.g., as a "sled" having certain ones of the computing system components described above with respect to FIG. 6. For example, a first type of sled may be composed of CPU elements, a second type of sled may be composed of system memory elements, a third type of sled may be composed of peripheral I/O elements, a fourth type of card may be composed of mass storage elements, etc. Alternatively or in combination a fourth type of sled (a blade) may approximately correspond to a computing system (e.g., having CPU, system memory, peripheral I/O and mass storage elements or some combination thereof). For example, in various embodiments, each blade comprises a separate computing platform that is configured to perform server-type functions. Accordingly, each blade includes components common to conventional servers, including a main printed circuit board (main board/motherboard) providing internal wiring (i.e., buses) for coupling appropriate integrated circuits (ICs) and other components mounted to the board.

Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

It is envisioned that aspects of the embodiments herein can be implemented in various types of computing and networking equipment, such as switches, routers and blade servers such as those employed in a data center and/or server farm environment. Typically, the servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities can typically employ large data centers with a multitude of servers.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." Some examples may be implemented using or as an article of manufacture or at least one computer-readable medium.

A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The invention claimed is:

1. A thermal control circuit, comprising:
a heating element disposed within an electronic circuit board having a semiconductor chip disposed thereon; and,
a power management integrated circuit coupled to the heating element, the power management integrated circuit to enable the heating element to heat the semiconductor chip to within the semiconductor chip's rated operating temperature range prior to the semiconductor chip being placed in an operational state.

2. The thermal control circuit of claim 1 wherein the power management integrated circuit includes an embedded processor to execute program code to control the heating of the heating element.

3. The thermal control circuit of claim 1 wherein the semiconductor chip is a system-on-chip.

4. The thermal control circuit of claim 1 wherein the electronic circuit board, semiconductor chip and power management integrated circuit are components of a computing system.

5. The thermal control circuit of claim 1 wherein the semiconductor chip is a commercial grade semiconductor chip.

6. The thermal control circuit of claim 1 wherein the power management integrated circuit is to enable the heating element prior to boot-up of a computing system that includes the electronic circuit board, the semiconductor chip and the power management integrated circuit.

7. The thermal control circuit of claim 1 wherein the electronic circuit board is a component within a computing system and the semiconductor chip comprises any of:
a general purpose processing core;
a memory controller;
a graphics processing core.

8. The thermal control circuit of claim 1 wherein the electronic circuit board is a component within a networking system and the semiconductor chip comprises any of:
a switch;
a router.

9. A machine readable storage medium containing program code that when processed by an embedded processor of a power management integrated circuit causes the power management integrated circuit to perform a method, comprising:
determine that a semiconductor chip's temperature is below its rated operating temperature range and, in response thereto, enable a heating element embedded in an electronic circuit board that the semiconductor chip is disposed on;
monitor the temperature of the semiconductor chip while the heating element is generating heat; and,
disable the heating element in response to the semiconductor chip's temperature having reached the rated operating temperature range.

10. The machine readable medium of claim 9 wherein the program code is executed prior to execution of a computing system's boot-up program code.

11. A method performed by a power management integrated circuit, comprising:
determining that a semiconductor chip's temperature is below its rated operating temperature range and, in response thereto, enabling a heating element embedded in an electronic circuit board that the semiconductor chip is disposed on;
monitoring the temperature of the semiconductor chip while the heating element is generating heat;
disabling the heating element in response to the semiconductor chip having reached the rated operating temperature.

12. The method of claim 11 wherein the power management integrated circuit is a component within a data center.

13. The method of claim 11 wherein the power management integrated circuit is a component within a computing system.

14. The method of claim 11 wherein the power management circuit is a component within a rack mountable sled.

* * * * *